United States Patent [19]

Kato et al.

[11] Patent Number: 4,994,884
[45] Date of Patent: Feb. 19, 1991

[54] GATE-CONTROLLED BI-DIRECTIONAL SEMICONDUCTOR SWITCHING DEVICE

[75] Inventors: Minoru Kato, Nagoya; Junichi Miwa, Yokohama, both of Japan

[73] Assignee: Kabushiki Kaisha Toshiba, Kawasaki, Japan

[21] Appl. No.: 174,982

[22] Filed: Mar. 29, 1988

[30] Foreign Application Priority Data

Mar. 31, 1987 [JP] Japan .................................. 62-76185
Dec. 23, 1987 [JP] Japan ................................ 62-325690

[51] Int. Cl.⁵ ......................................... H01L 29/747
[52] U.S. Cl. ..................................... 357/39; 357/38
[58] Field of Search ................................. 357/39, 38

[56] References Cited

U.S. PATENT DOCUMENTS

| | | | |
|---|---|---|---|
| 4,286,279 | 8/1981 | Hutson | 357/39 |
| 4,529,998 | 7/1985 | Lade et al. | 357/38 |
| 4,611,128 | 9/1986 | Patalong | 357/39 |
| 4,635,086 | 1/1987 | Miwa et al. | 357/38 |

FOREIGN PATENT DOCUMENTS

| | | | |
|---|---|---|---|
| 0025291 | 3/1981 | European Pat. Off. | |
| 0146040 | 6/1985 | European Pat. Off. | |
| 3118317 | 11/1982 | Fed. Rep. of Germany | 357/39 |
| 58-3280 | 1/1983 | Japan | 357/39 |
| 2135511A | 8/1984 | United Kingdom | 357/39 |

OTHER PUBLICATIONS

Sora K. Ghandhi, Semiconductor Power Devices, pp. 220–221.

Primary Examiner—Rolf Hille
Assistant Examiner—Steven Loke
Attorney, Agent, or Firm—Finnegan, Henderson, Farabow, Garrett & Dunner

[57] ABSTRACT

In the gate-controlled bi-directional semiconductor switching device, when a negative trigger signal is applied to a second electrode functioning as a gate electrode, a second auxiliary thyristor formed of the sixth, third, first and eighth conductive layers is turned on, causing an ON current to be supplied as a gate current to a main thyristor formed of the fifth, second, first and eighth conductive layers via the first wiring. When a positive trigger signal is applied to the second electrode, a first auxiliary thyristor formed of the seventh, fourth, first and eighth conductive layers is turned on, causing an ON current to be supplied as a gate current to the main thyristor via the second wiring. Since the second electrode is connected to the fourth and sixth conductive layers of the first and second auxiliary thyristors are formed separately from the third and seventh conductive layers, invalid current components in the first and second thyristors are reduced to a minimum. This enhances the gate sensitivity particularly in operation modes I and II.

9 Claims, 8 Drawing Sheets

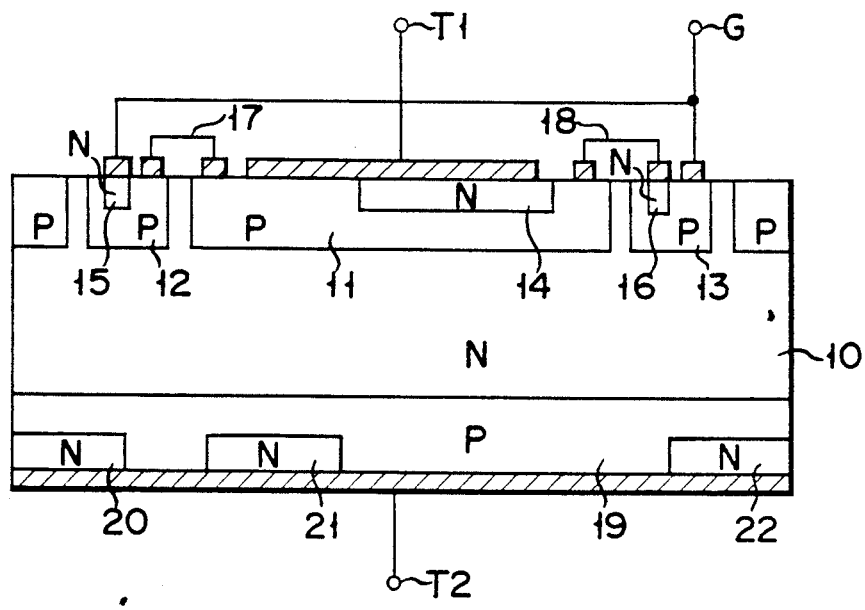
F I G. 2

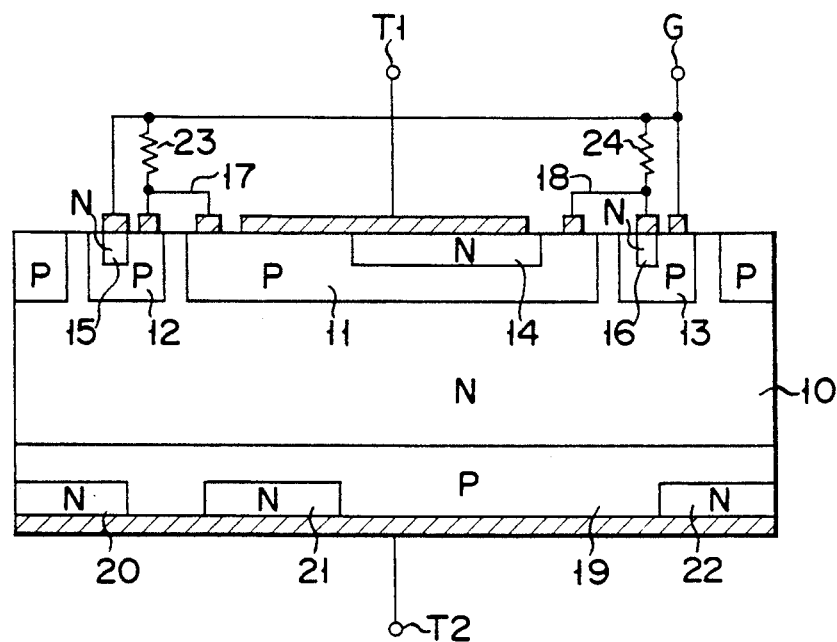
F I G. 5
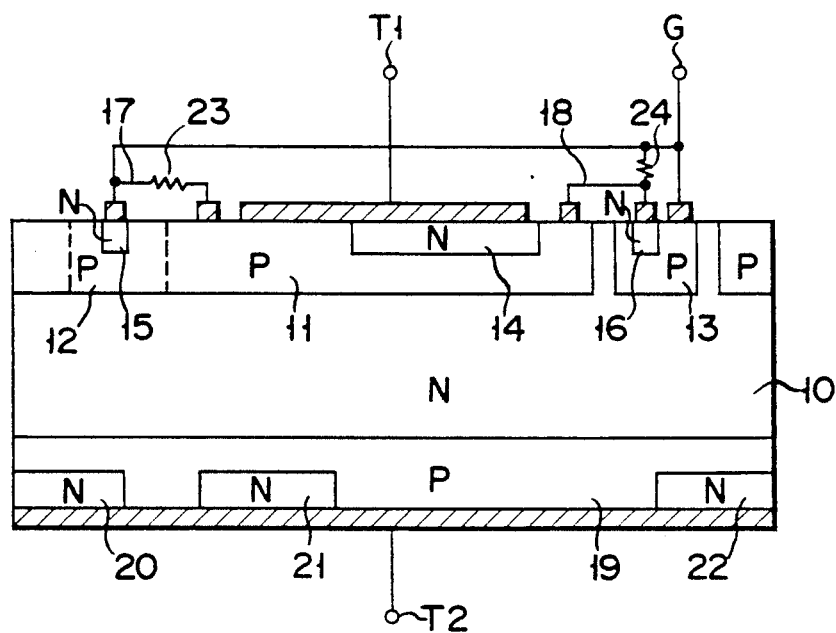
F I G. 6

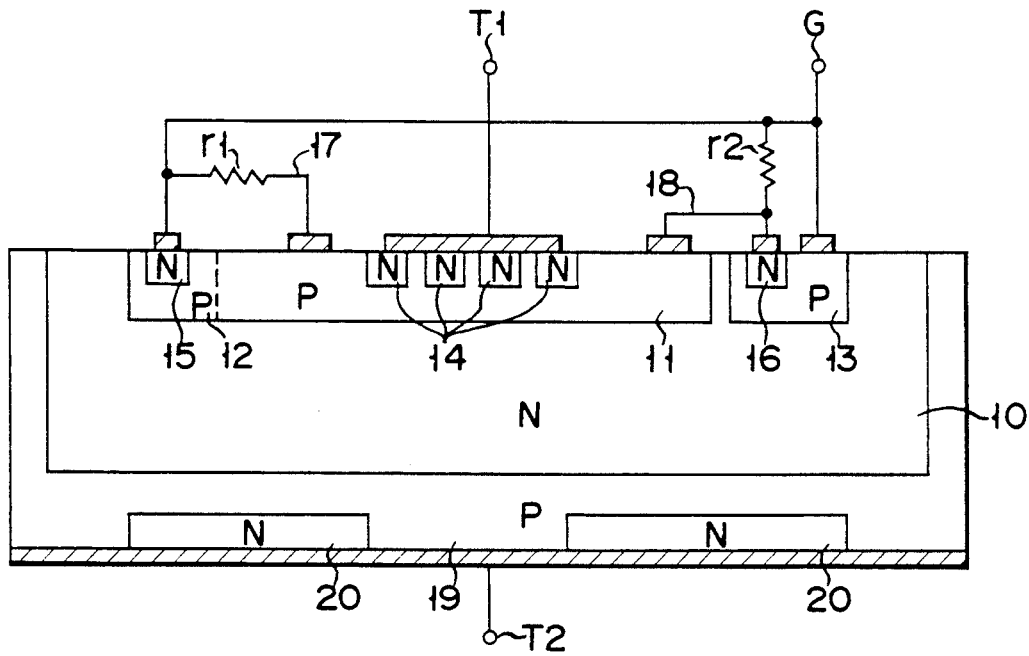
F I G. 11
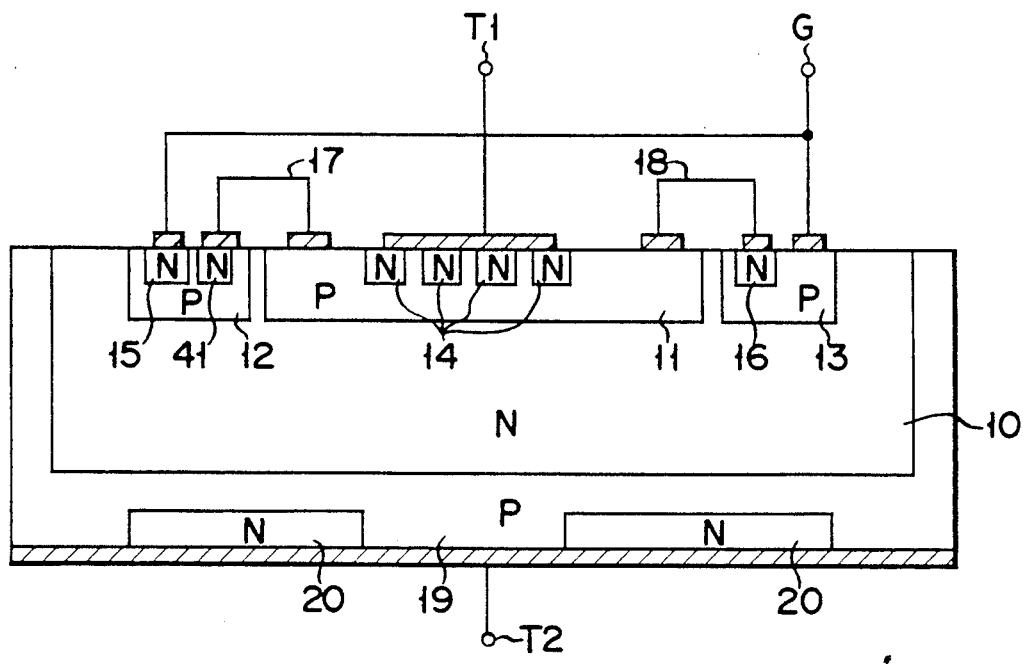
F I G. 12

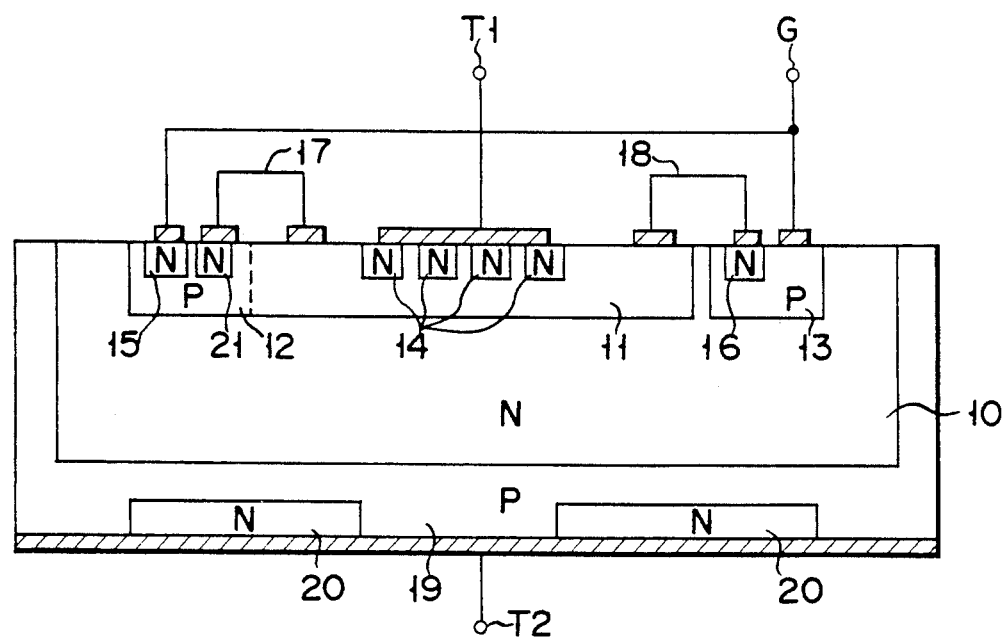
F I G. 13
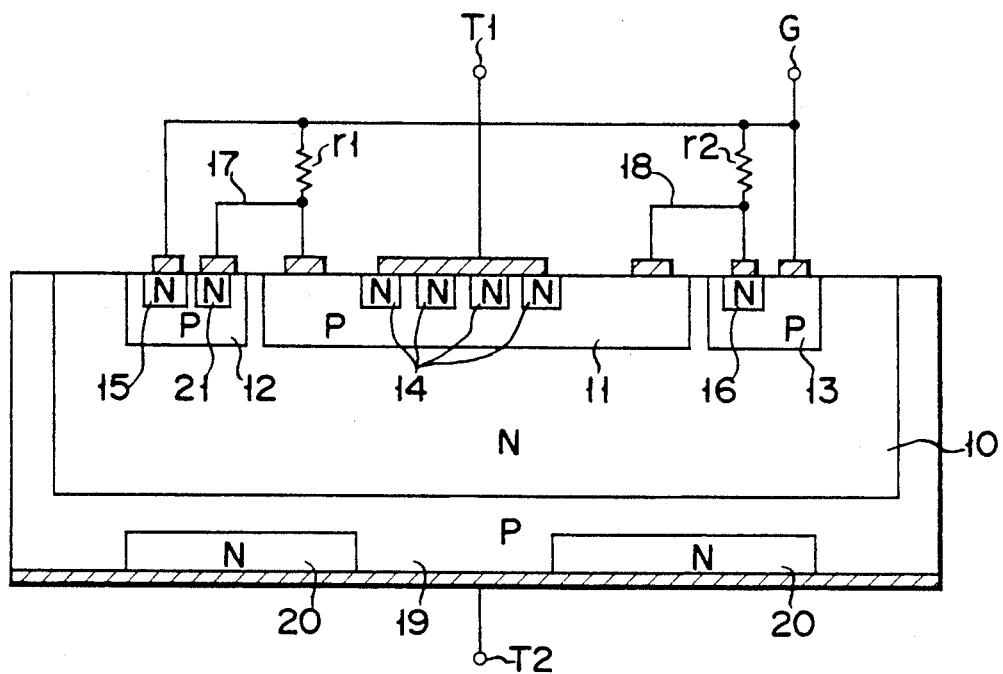
F I G. 14

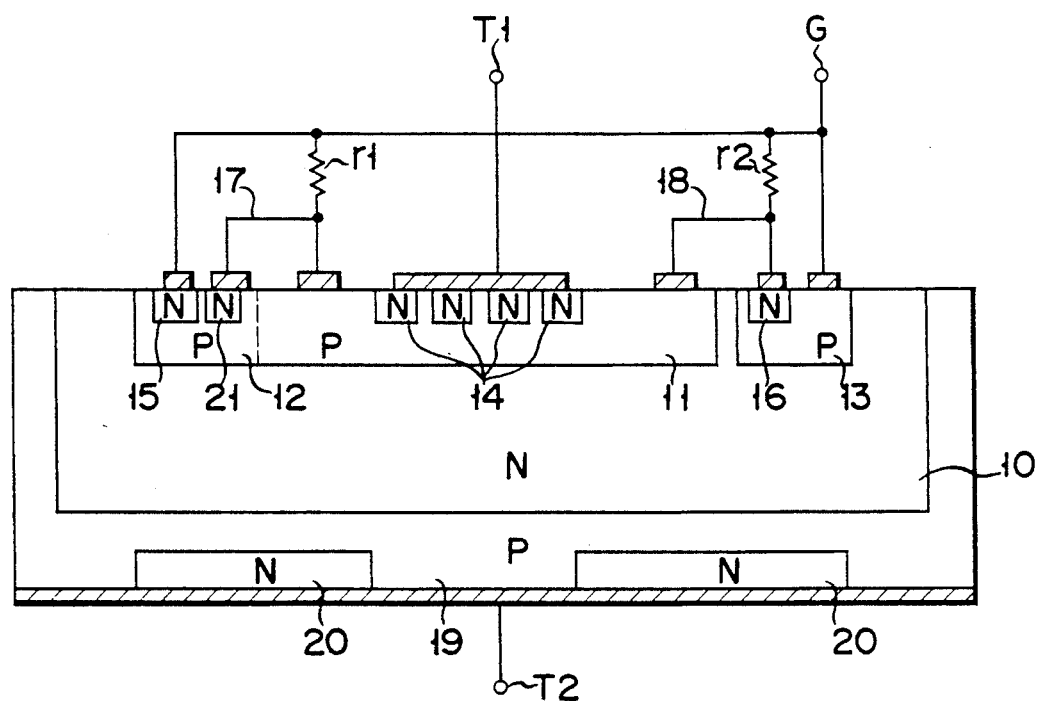
F I G. 15

4,994,884

1

GATE-CONTROLLED BI-DIRECTIONAL SEMICONDUCTOR SWITCHING DEVICE

BACKGROUND OF THE INVENTION

1. Field of the Invention

This invention relates to a gate-controlled bi-directional semiconductor switching device such as a triac, and more particularly to an improvement in the gate sensitivity thereof.

2. Description of the Related Art

A conventional triac which is one type of a bi-directional semiconductor switching device is formed to have such a cross section as shown in FIG. 1. In FIG. 1, 30 denotes N-type layer, 31 and 32 P-type layers, and 33, 34, 35 and 36 N-type layers. Electrode T1 is formed in contact with P-type layer 31 and N-type layer 33, gate electrode G is formed in continuous contact with N-type layer 34 and P-type layer 31, and electrode T2 is formed in continuous contact with P-type layer 32 and N-type layers 35 and 36.

Gate electrode G and a portion of P-type layer 31 lying under gate electrode G constitute the gate structure of a thyristor, and a remote gate structure is formed of an NPN transistor structure which is constituted by N-type layer 33, P-type layer 31 and N-type layer 30 and an NPN transistor structure which is constructed by N-type layer 34, P-type layer 31 and N-type layer 30. Further, N-type layer 34 and P-type layer 31 constitute a junction gate structure.

Four modes I, II, III and IV are provided to turn on the triac with the construction described above. In mode I, the gate structure of the thyristor is used to turn on the triac. That is, the triac is turned on by applying a positive trigger to gate electrode G when electrodes T1 and T2 are respectively set at positive and negative potentials. In mode II, the junction gate structure is used, and the triac is turned on by applying a negative trigger to gate electrode G when electrodes T1 and T2 are set respectively at positive and negative potentials. In mode III, the remote gate structure is used, and the triac is turned on by applying a negative trigger to gate electrode G when electrodes T1 and T2 are set respectively at negative and positive potentials. Further, in mode IV, the remote gate structure is used, and the triac is turned on by applying a positive trigger to gate electrode G when electrodes T1 and T2 are set respectively at negative and positive potentials.

In order to enhance the gate sensitivity of the conventional triac shown in FIG. 1, it is necessary to reduce an invalid current component or current which flows along the surface of a P-type base formed of P-type layer 31 and which is not contributed to an injection current. For this purpose, it has been effected to increase the resistance of a surface layer of P-type layer 31 by lowering the impurity concentration of the surface layer, or from an N-type diffusion layer which functions as a barrier interrupting the current flow in P-type layer 31. However, in either case, the gate sensitivity cannot be enhanced without deteriorating other main characteristics. For example, increase in the gate sensitivity is accompanied by deterioration in high temperature characteristics, reduction in the withstanding amount of dv/dt at the time of commutation and the like. Further, from the standpoint of the operation principle of the triac, an N-type emitter formed of N-type layer 33 must be formed in the shorted structure, thereby limiting the high sensitivity attained by the fine control for the impurity diffusion.

Under this condition, it is difficult to enhance the gate sensitivity of the conventional triac to such a degree that the triac can be directly driven by an output from a semiconductor integrated circuit (IC).

As described above, in the conventional gate-controlled bi-directional semiconductor switching device, it is difficult to enhance the gate sensitivity without lowering the characteristics such as withstanding amount of dv/dt.

SUMMARY OF THE INVENTION

This invention has been made in view of the fact described above, and an object thereof is to provide a gate-controlled bi-directional semiconductor switching device in which the gate sensitivity can be enhanced without lowering the withstanding amount of dv/dt.

A gate-controlled bi-directional semiconductor switching device of this invention comprises a first conductive layer of a first conductivity type; second to fourth conductive layers of a second conductivity type which are separately formed in a first surface area of the first conductive layer; fifth to seventh conductive layers of the first conductivity type respectively formed in the surface areas of the second to fourth conductive layers; an eighth conductive layer of the second conductivity type formed in a second surface area of the first conductive layer; a ninth conductive layer of the first conductivity type formed in the surface area of the eighth conductive layer; a first electrode formed in continuous contact with the second and fifth conductive layers; a second electrode connected to the fourth and sixth conductive layers; a third electrode formed in continuous contact with the eighth and ninth conductive layers; a first wiring for connecting the second and third conductive layers to each other; and a second wiring for connecting the second and seventh conductive layers to each other.

In the gate-controlled bi-directional semiconductor switching device of this invention, when a negative trigger signal is applied to the second electrode functioning as a gate electrode, a second auxiliary thyristor formed of the sixth, third, first and eighth conductive layers is turned on, causing an ON current to be supplied as a gate current to a main thyristor formed of the fifth, second, first and eighth conductive layers via the first wiring. When a positive trigger signal is applied to the second electrode, a first auxiliary thyristor formed of the seventh, fourth, first and eighth conductive layers is turned on, causing an ON current to be supplied as a gate current to the main thyristor via the second wiring.

Since, in this case, the second electrode connected to the fourth and sixth conductive layers of the first and second auxiliary thyristors are formed separately from the third and seventh conductive layers, invalid current components in the first and second thyristors are reduced to a minimum. This enhances the gate sensitivity particularly in operation modes I and II.

Another gate-controlled bi-directional semiconductor switching device of this invention comprises a first conductive layer of a first conductivity type; second to fourth conductive layers of a second conductivity type which are separately formed in a first surface area of the first conductive layer; fifth to seventh conductive layers of the first conductivity type respectively formed in the surface areas of the second to fourth conductive layers; an eighth conductive layer of the second conductivity type formed in a second surface area of the first conductive layer; a ninth conductive layer of the first conductivity type formed in the surface area of the eighth conductive layer; a first electrode formed in continuous contact with the second and fifth conductive layers; a second electrode connected to the fourth and sixth conductive layers; a third electrode formed in continuous contact with the eighth and ninth conductive layers; a first wiring for connecting the second and third conductive layers to each other; and a second wiring for connecting the second and seventh conductive layers to each other.

In the semiconductor switching device described above, when a negative trigger signal is applied to the second electrode functioning as a gate electrode, a second auxiliary thyristor formed of the sixth, third, first and eighth conductive layers is turned on, causing an ON current to be supplied as a gate current to a main thyristor formed of the fifth, second, first and eighth conductive layers via the first wiring. When a positive trigger signal is applied to the second electrode, a first auxiliary thyristor formed of the seventh, fourth, first and eighth conductive layers is turned on, causing an ON current to be supplied as a gate current to the main thyristor via the second wiring.

Since, in this case, the second electrode connected to the fourth and sixth conductive layers of the first and second auxiliary thyristors are formed separately from the third and seventh conductive layers, invalid current components in the first and second thyristors are reduced to a minimum. This enhances the gate sensitivity particularly in operation modes I and II.

BRIEF DESCRIPTION OF THE DRAWINGS

FIG. 2 is a cross sectional view of a triac according to an embodiment of this invention;

FIGS. 4 to 6 are cross sectional views respectively showing triacs according to other embodiments of this invention;

FIGS. 9 to 15 are cross sectional views respectively showing triacs according to other embodiments of this invention.

DETAILED DESCRIPTION OF THE PREFERRED EMBODIMENTS

Figure 3:
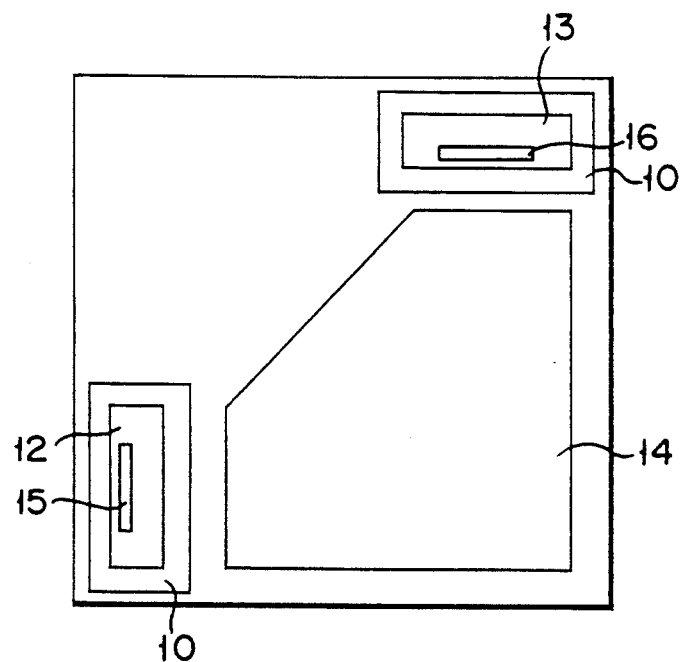
FIG. 3 is a schematic plane pattern view of the triac shown in FIG. 2.

There will now be described embodiments of this invention with respect to the accompanying drawings. FIG. 2 is a cross sectional view showing the element structure of a gate-controlled bi-directional switching device of this invention which is constructed in the form of a triac, and FIG. 3 is a schematic plane pattern view of the surface of the element on which the gate electrode is formed. The triac shown in FIGS. 2 and 3 is formed by preparing substrate 10 which has a thickness of 250 $\mu$m and a resistivity of 40 $\Omega$·cm, and utilizing conventional oxidation technique, impurity diffusion technique and lithographic technology. That is, P-type layers 11, 12 and 13 are separately formed in one surface area of N-type layer 10. In this case, the surface impurity concentration of the P-type layers is set at $1 \times 10^{17}$ to $2 \times 10^{17}$/cm$^2$, and diffusion depth xj is set to 40 to 50 $\mu$m. N-type layers 14, 15 and 16 are respectively formed in P-type layers 11, 12 and 13. The surface impurity concentration of the N-type layers is set to a value of the order of $10^{21}$/cm$^2$, and diffusion depth xj is set below approx. 20 $\mu$m. Further, electrode T1 is formed in continuous contact with P-type layer 11 and N-type layer 14. That is, electrode T1 is formed on P-type layer 11 and N-type layer 14 with the contact portion therebetween being continuous. Gate electrode G is formed on electrode 100 connects layers 13 and 15 P-type layer 13 and N-type layer 15. P-type layers 11 and 12 are connected together by means of wiring 17, and P-type layer 11 and N-type layer 16 are connected together by means of wiring 18.

In the other surface area of N-type layer 10, P-type layer 19 is formed. The P-type layer is formed to have the surface impurity concentration of $1 \times 10^{17}$ to $2 \times 10^{17}$/cm$^2$ and diffusion depth xj of 40 to 50 $\mu$m which are the same as in the case of P-type layers 11, 12 and 13. Further, N-type layers 20, 21 and 22 are separately formed in the surface area of P-type layer 19. N-type layers 20, 21 and 22 may be commonly formed. In the same manner as in N-type layers 14, 15 and 16, the N-type layers are formed to have the surface impurity concentration of the order of $10^{21}$/cm$^2$ diffusion depth xj of less than 20 $\mu$m.

N-type layer 14, P-type layer 11, N-type substrate 10 and P-type layer 19 constitute a first main thyristor in which current flows in a first direction, and N-type layer 21, P-type layer 19, N-type substrate 10 and P-type layer 11 constitute a second main thyristor in which current flows in a second direction. Further, N-type layer 16, P-type layer 13, N-type substrate 10 and P-type layer 19 constitute a first auxiliary thyristor which functions in response to a positive gate input signal, and N-type layer 15, P-type layer 12, N-type substrate 10 and P-type layer 19 constitute a second auxiliary thyristor which functions in response to a negative gate input signal.

Now, the operation of the triac with the construction described above is explained.

The operation in mode I (T2 and G are positive electrodes) is the same as that of the thyristor. That is, when a positive trigger signal is applied to gate electrode G, carriers are injected from N-type layer 16 to P-type layer 13, turning on the first auxiliary thyristor which is constituted by N-type layer 16, P-type layer 13, N-type layer 10 and P-type layer 19. An ON current generated at this time is supplied as a gate current to P-type layer 11 via wiring 18. Since, in this case, gate electrode G is not connected to P-type layer 11 but only to P-type layer 13, an invalid current component contained in the gate current can be considerably reduced. After this, carriers are injected from N-type layer 14 to P-type layer 11, turning on the first main thyristor constituted by N-type layer 14, P-type layer 11, N-type layer 10 and P-type layer 19.

For example, the first auxiliary thyristor is turned on by a gate current of several $\mu$A, and the maximum ON current becomes approx. several hundreds mA, making it possible to set the first main thyristor in the ON condition. Thus, the gate sensitivity in the operation in mode I can be set sufficiently high.

The operation in mode II (T2 and G are positive and negative electrodes, respectively) is also the same as that of the thyristor. That is, when a negative trigger signal is applied to gate electrode G, carriers are injected from N-type layer 15 to P-type layer 12, turning on the second auxiliary thyristor which is constituted by N-type layer 15, P-type layer 12, N-type layer 10 and P-type layer 19. An ON current generated at this time is first supplied to a gate circuit (not shown), limited by the gate resistor, provided therein, and then supplied as a gate current to P-type layer 11 via wiring 17 when the gate potential is set positive with respect to T1. Since, in this case, gate electrode G is not connected to P-type layer 11 but only to N-type layer 15, an invalid current component contained in the gate current can be considerably reduced. After this, in the same manner as in mode I, carriers are injected from N-type layer 14 into P-type layer 11, turning on the first main thyristor constituted by N-type layer 14, P-type layer 11, N-type layer 10 and P-type layer 19.

Also, in this case, the second auxiliary thyristor is turned on by a gate current of several $\mu A$, for example, and the maximum ON current becomes several hundreds mA, making it possible to set the first main thyristor in the ON condition. Thus, the gate sensitivity in the operation of mode I can also be set sufficiently high.

In the operation of mode III (T2 and G are negative electrodes), a negative trigger signal is applied to gate electrode G, causing an NPN transistor constituted by N-type layer 15, P-type layer 12 and N-type layer 10 to perform the remote gate operation. In the remote gate operation, electrons injected from N-type layer 15 to P-type layer 12 reaches N-type substrate 10 to strongly forward-bias the junction between P-type layer 12 and N-type substrate 10, causing holes to be injected from P-type layer 12 into N-type substrate 10. When the holes have reached P-type layer 19 and move in a lateral direction, a voltage drop occurs to start the injection of electrons from N-type layer 20. This turns on the main thyristor constituted by P-type layer 11, N-type substrate 10, P-type layer 19 and N-type layer 21.

In the operation of mode IV (T2 and G are negative and positive electrodes, respectively), a positive trigger signal is applied to gate electrode G, causing an NPN transistor constituted by N-type layer 15, P-type layer 12 and N-type layer 10 to perform the remote gate operation. Current generated at this time is supplied as a gate current to P-type layer 11 via wiring 18, turning on the second main thyristor.

In the operation of modes III and IV, such a large gate current as in modes I and II cannot be supplied to the second main thyristor. Therefore, the gate sensitivity will be lowered in comparison with the cases of modes I and II. However, since an invalid current component contained in the gate current can be considerably reduced in the first and second auxiliary thyristors, the gate sensitivity in modes III and IV can be enhanced in comparison with the conventional case. In the triac of the above embodiment, the gate driving critical current in modes I to IV can be set to several $\mu A$. In general, the maximum output current in the IC is approx. 5 mA, and the triac of the embodiment can be reliably driven by the IC output.

Further, in the device of the above embodiment, the main thyristors are separated from the auxiliary thyristors, and the withstanding amount of dv/dt at the time of commutation can be enhanced by the effect that the main thyristors are separately arranged from the auxiliary thyristors. In contrast, even if the gate driving critical current in modes I to III of the conventional device can be set to 5 mA, the gate driving critical current in mode IV will be set to 20 mA which is four times that of the former case and it cannot be directly driven by the IC output.

Figure 4:
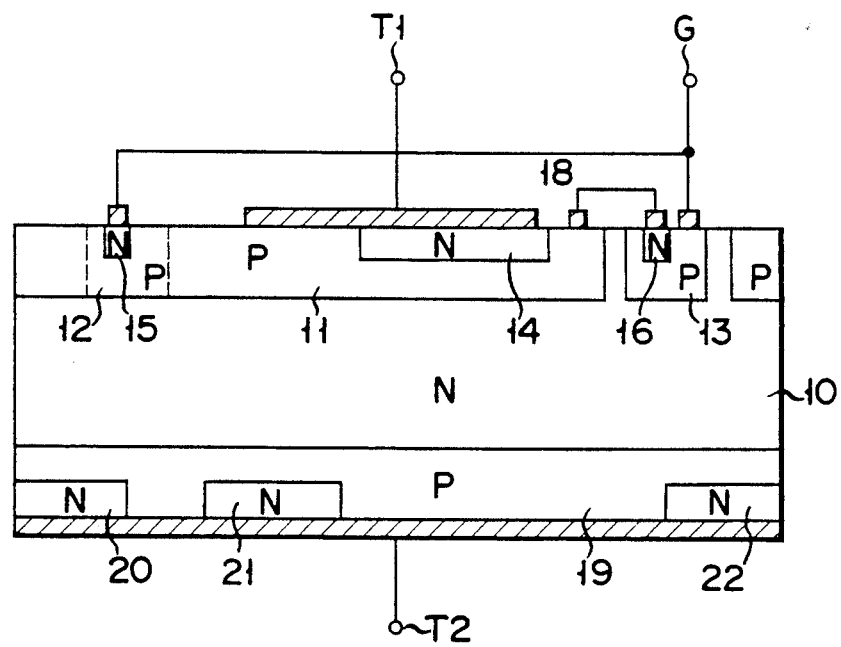

FIG. 4 is a cross sectional view of another element construction of a triac which can be attained by the gate-controlled bi-directional semiconductor switching device of this invention. In the device of this embodiment, P-type layer 12 in the second auxiliary thyristor of the embodiment shown in FIG. 2 and P-type layer 11 of the first and second main thyristors are formed of a common layer. With this construction which is different from that of the embodiment of FIG. 2, it is not necessary to separate P-type layer 12 from P-type layer 11, and therefore, the element area can be reduced.

In the triac of the above embodiments, the withstanding amount of dv/dt can be determined by means of the first and second auxiliary thyristors. Therefore, as shown in FIGS. 5 and 6, if resistors 23 and 24 are connected between N-type layer 15 and P-type layer 12 and between N-type layer 16 and P-type layer 13, the gate sensitivity may be slightly lowered but the withstanding amount of dv/dt can be improved. In the case where the PN junction voltage is set at 0.6 V and the gate input current to the main thyristor is set at 5 mA, the resistance of resistors 23 and 24 is set at 0.6 V/5 mA, that is, 120 $\Omega$, preferably at 300 $\Omega$.

Figure 7:
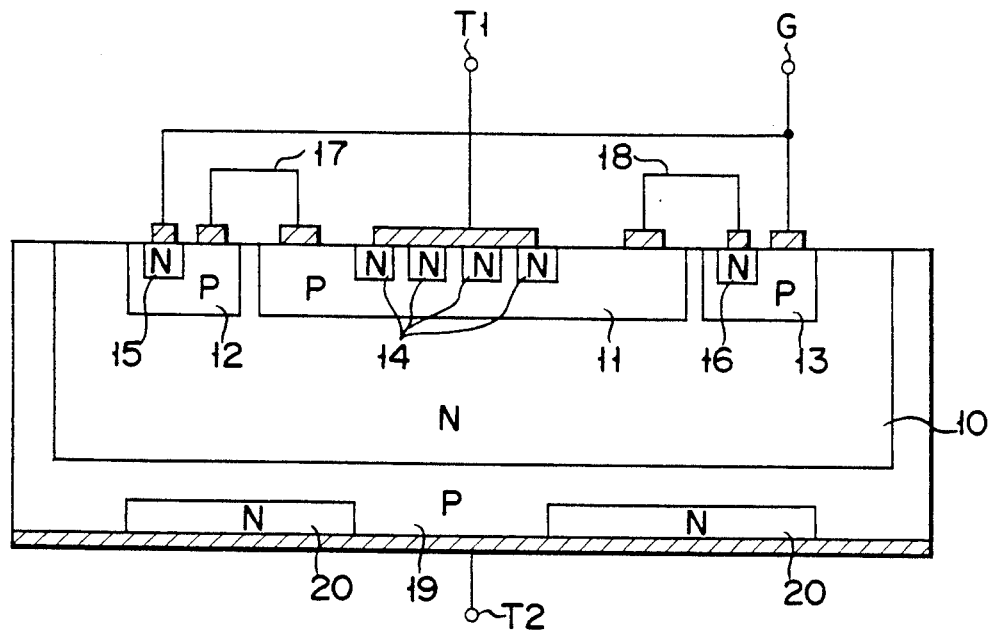
FIG. 7 is a cross sectional view showing a triac according to still another embodiment of this invention.
Figure 8:
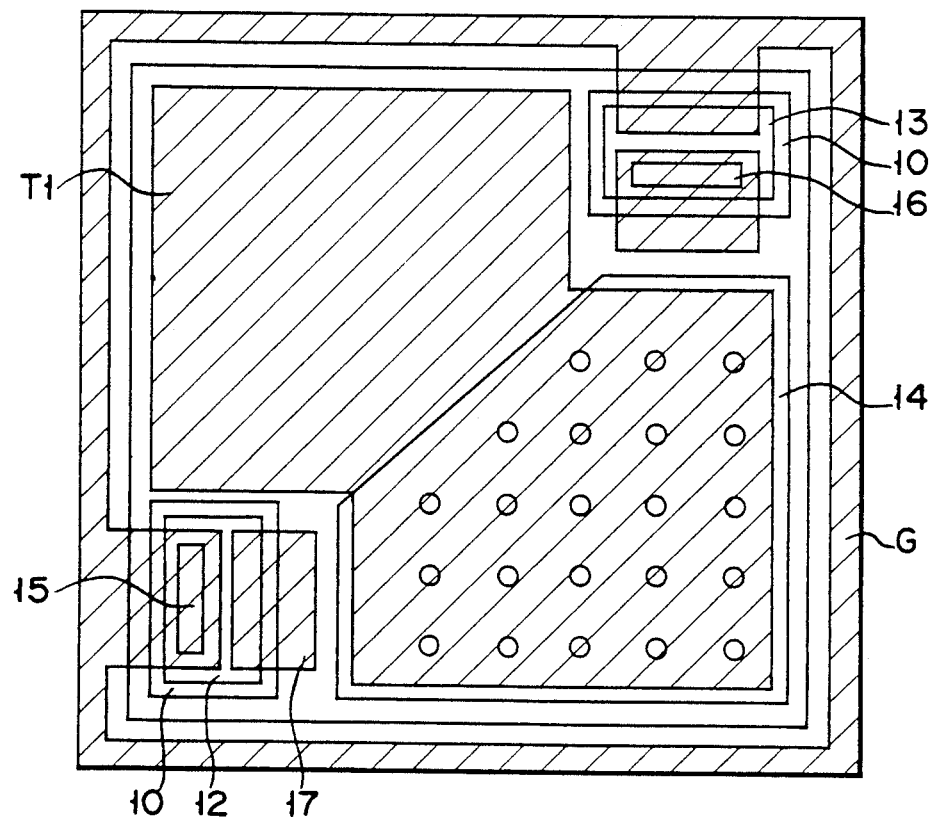
FIG. 8 is a schematic plane pattern view of the triac shown in FIG. 7.

FIG. 7 is a cross sectional view of still another element construction of a triac which can be attained by the gate-controlled bi-directional semiconductor switching device of this invention. FIG. 8 is a schematic plane pattern view of the element surface in which gate electrodes of the triac are formed. The device of this embodiment is similar to that of FIG. 2 except that N-type layer 14 is formed of a plurality of layers and N-type layers 20 are commonly formed. N-type layers 20 may be separatedly formed. The operations in modes I to IV are the same as in the embodiments described above.

Also in this embodiment, since gate electrode G is not connected to P-type layer 11 but only to P-type layer 13 and N-type layer 15, an invalid current component contained in the gate current is considerably reduced.

Since, also in this embodiment as in the embodiment of FIG. 2, such a large gate current as obtained in modes I and II cannot be supplied to the second main thyristor in modes III and IV, the gate sensitivity will be lowered in comparison with the cases of modes I and II. However, since an invalid current component contained in the gate current can be considerably reduced in the first and second auxiliary thyristors, the gate sensitivity in modes III and IV can be enhanced in comparison with the conventional case. In the triac of the above embodiment, the gate driving critical current in modes I to III can be set to several $\mu A$. In general, the maximum output current in the IC is approx. 5 mA, and the triac of the embodiment can be reliably driven by the IC output.

Further, in the device of the above embodiment, the main thyristors are separated from the auxiliary thyristors, and the withstanding amount of dv/dt at the time of commutation can be enhanced by the effect that the main thyristors are separately arranged from the auxiliary thyristors. In contrast, even if the gate driving critical current in modes I to III of the conventional device can be set to 5 mA, the gate driving critical current in mode IV will be set to 20 mA which is four times that of the former case and it cannot be directly driven by the IC output.

Figure 9:
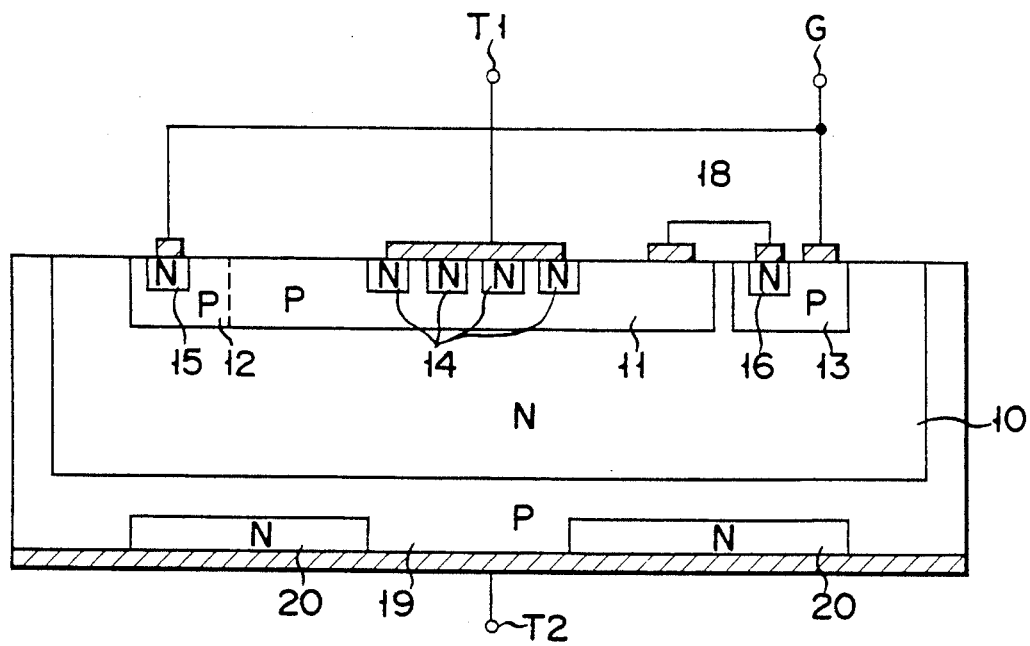

FIG. 9 is a cross sectional view of another element construction of a triac which can be attained by the gate-controlled bi-directional semiconductor switching device of this invention. In the device of this embodiment, P-type layer 12 in the second auxiliary thyristor of the embodiment shown in FIG. 7 and P-type layer 11 of the first and second main thyristors are formed of a common layer. With this construction which is different from that of the embodiment of FIG. 7, it is not necessary to separate P-type layer 12 from P-type layer 11, and therefore, the element area can be reduced.

Figure 10:
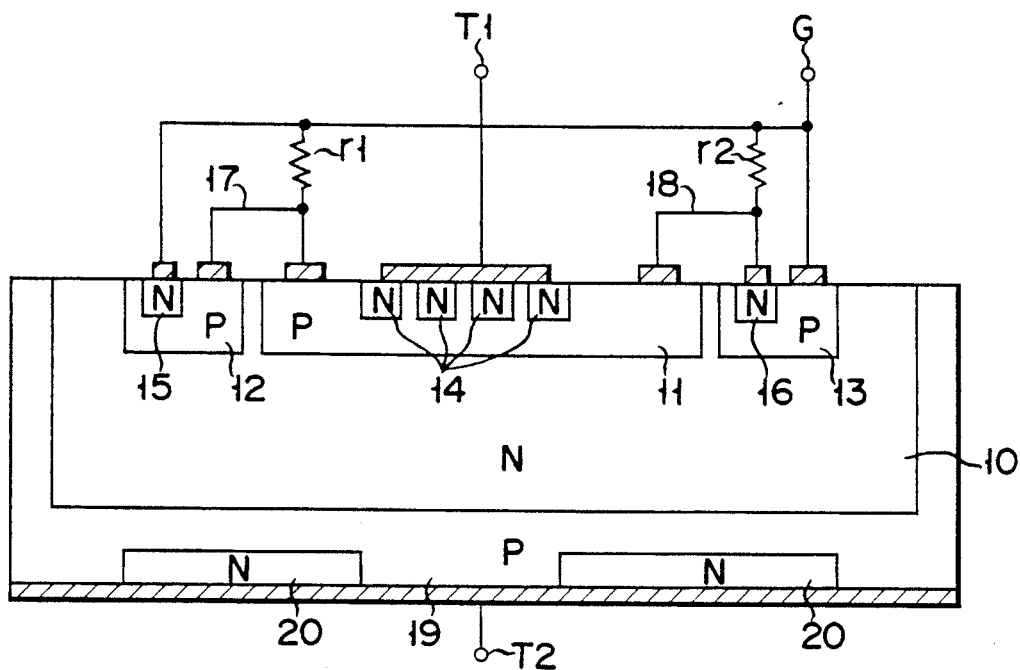

In the same manner as in the embodiments of FIGS. 2 and 4, triac of the above embodiment shown in FIGS. 7 and 8, the withstanding amount of dv/dt can be determined by means of the first and second auxiliary thyristors. Therefore, as shown in FIGS. 10 and 11, if resistors r1 and r2 are connected between N-type layer 15 and P-type layer 12 and between N-type layer 16 and P-type layer 13, the gate sensitivity may be slightly lowered but the withstanding amount of dv/dt can be improved. In the case where the PN junction voltage is set at 0.6 V and the gate input current to the main thyristor is set at 5 mA, the resistance of resistors r1 and r2 is set at 0.6 V/5 mA, that is, 120 Ω, preferably at 300 Ω.

There will now be described the operation in the case where the triac with the construction of FIG. 9 (or FIGS. 10 and 11) is operated in mode II. When a negative trigger signal is applied to gate electrode G, the PN junction between N-type layer 15 and P-type layer 12 of the second auxiliary thyristor is forward-biased, causing current to be supplied from electrode T1 to gate electrode G via P-type layer 11 and wiring 17 (if wiring 17 is employed). When the sum of current amplification factor αP of an NPN transistor formed of N-type layer 15, P-type layer 12 and N-type layer 10 and current amplification factor αN of a PNP transistor formed of P-type layer 12, N-type layer 10 and P-type layer 19 exceeds 1 (one), an auxiliary thyristor formed of N-type layer 15, P-type layer 12, N-type layer 10 and P-type layer 19 is turned on, permitting current to flow into a gate circuit (not shown) connected to gate electrode G. The current is limited by a gate resistor (not shown) provided in the gate circuit. When the gate potential becomes higher than the potential at electrode T1, excessive holes in P-type layer 12 are discharged towards electrode T1. That is, current starts to flow towards electrode T1, and the first main thyristor formed of N-type layer 14, P-type layer 11, N-type layer 10 and P-type layer 19 starts to be turned on.

Figure 1:
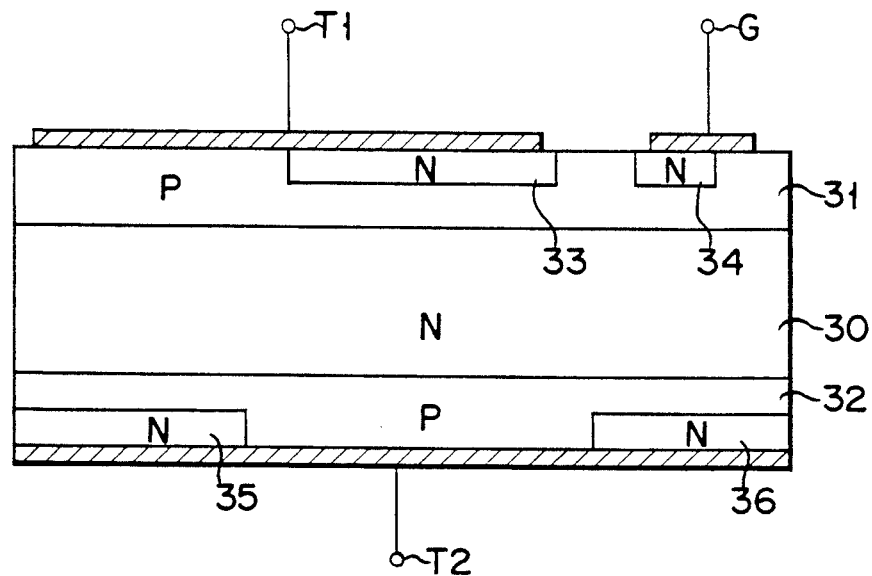
FIG. 1 is a cross sectional view of the conventional triac.

The sensitivity in the operation of mode II is improved in comparison with the conventional device of FIG. 1, but is still lower than in the case of the operation of mode I.

FIG. 12 is a cross sectional view of an element structure of a triac which is obtained by a semiconductor switching device of this invention. The triac of this embodiment is similar to that of FIG. 7 except that another N-type layer 41 is formed separately from N-type layer 15 in the surface area of P-type layer 12 constituting the second auxiliary thyristor. Wiring 17 is formed to connect N-type layer 41 and P-type layers 11 and 12.

Since N-type layer 41 is additionally formed in the triac of FIG. 12, an auxiliary junction thyristor formed of N-type layer 41, P-type layer 12, N-type layer 10 and P-type layer 19 is added to that of FIG. 7.

In the triac, the second auxiliary thyristor formed of N-type layer 15, P-type layer 12, N-type layer 10 and P-type layer 19 is turned on in mode II in which electrode T2 and gate electrode G are used as positive and negative electrodes, respectively. After this, when the gate potential becomes higher than the potential at electrode T1, current flows from P-type layer 12 to N-type layer 41, starting to turn on the junction thyristor formed of N-type layer 41, P-type layer 12, N-type layer 10 and P-type layer 19. Then, the ON current is supplied as a gate current to P-type layer 11 via wiring 17 to turn on the first main thyristor formed of N-type layer 14, P-type layer 11, N-type layer 10 and P-type layer 19. In this case, the auxiliary junction thyristor formed of N-type layer 41, P-type layer 12, N-type layer 10 and P-type layer 19 performs the amplification gate function with respect to the first main thyristor formed of N-type layer 14, P-type layer 11, N-type layer 10 and P-type layer 19. The operation in modes other than mode II are the same as is described with reference to the triac of FIG. 7, and therefore the explanation thereof is omitted. As shown in FIG. 13, it is possible to reduce the element area of the triac of FIG. 12 by forming P-type layer 11 and P-type layer 12 by using a common layer in the same manner as in FIG. 4. Further, as shown in FIG. 14, it is possible to improve the withstanding amount of dv/dt by connecting resistors r1 and r2 between N-type layer 15 and P-type layer 21 and between N-type layer 16 and P-type layer 13. As shown in FIG. 15, it is also possible to form P-type layers 11 and 12 by using a single common layer and connect resistors r1 and r2 between N-type layer 15 and P-type layer 21 and between N-type layer 16 and P-type layer 13. In this case, the element area can be reduced and at the same time the withstanding amount of dv/dt can be improved.

As described above, according to this invention, it is possible to provide a gate-controlled bi-directional semiconductor switching device in which the gate sensitivity can be enhanced without deteriorating the characteristics such as withstanding amount of dv/dt.

What is claimed is:

1. A gate-controlled bi-directional semiconductor switching device comprising:
   a first conductive layer of a first conductivity type;
   second to fourth conductive layers of a second conductivity type which are separately formed in a first surface area of said first conductive layer, the third conductive layer being located at one side of the second conductive layer, and the fourth conductive layer being located at the other side of the second conductive layer;
   fifth to seventh conductive layers of the first conductivity type respectively formed in the surface areas of said second to fourth conductive layers;
   an eighth conductive layer of the second conductivity type formed in a second surface area of said first conductive layer;
   a ninth conductive layer of the first conductivity type formed in the surface area of said eighth conductive layer;
   a first electrode formed in continuous contact with said second and fifth conductive layers;
   a second electrode connected to said fourth and sixth conductive layers;
   a third electrode formed in continuous contact with said eighth and ninth conductive layers;
   a first wiring for connecting said second and third conductive layers to each other; and a second wiring for connecting said second and seventh conductive layers to each other.

2. A semiconductor switching device according to claim 1, wherein said second and third conductive layers are integrally formed.

3. A semiconductor switching device according to claim 1 or 2, further comprising a resistor connected between said second conductive layer and sixth conductive layer and a resistor connected between said second conductive layer and seventh conductive layer.

4. A semiconductor switching device according to claim 1 or 2, wherein said fifth conductive layer is formed of a plurality of layers.

5. A semiconductor switching device according to claim 1, further comprising a tenth conductive layer of the first conductivity type which is formed separately from said sixth conductive layer and in connection with said first wiring in the surface area of said third conductive layer.

6. A gate-controlled bi-directional semiconductor switching device comprising:
- a first conductive layer of a first conductivity type;
- second to fourth conductive layers of a second conductivity type which are separately formed in a first surface area of said first conductive layer, the third conductive layer being located at one side of the second conductive layer, and the fourth conductive layer being located at the other side of the second conductive layer;
- fifth to seventh conductive layers of the first conductivity type respectively formed in the surface areas of said second to fourth conductive layers;
- an eighth conductive layer of the second conductivity type formed in a second surface area of said first conductive layer;
- a ninth conductive layer of the first conductivity type formed in the surface area of said eighth conductive layer;
- a tenth conductive layer of the first conductivity type formed separately from said sixth conductive layer in the surface area of said third conductive layer;
- a first electrode formed in continuous contact with said second and fifth conductive layers;
- a second electrode connected to said fourth and sixth conductive layers;
- a third electrode formed in continuous contact with said eighth and ninth conductive layers;
- a first wiring for connecting said second and tenth conductive layers to each other; and
- a second wiring for connecting said second and seventh conductive layers to each other.

7. A semiconductor switching device according to claim 6, wherein said second and third conductive layers are integrally formed.

8. A semiconductor switching device according to claim 6, wherein said fifth conductive layer is formed of a plurality of layers.

9. A semiconductor switching device according to any one of claims 6 to 8, further comprising a resistor connected between said second conductive layer and sixth conductive layer and a resistor connected between said second conductive layer and seventh conductive layer.

* * * * *